(12) United States Patent
Koyanagi

(10) Patent No.: US 11,600,527 B2
(45) Date of Patent: Mar. 7, 2023

(54) LIFT-OFF METHOD FOR TRANSFERRING OPTICAL DEVICE LAYER

(71) Applicant: DISCO CORPORATION, Tokyo (JP)

(72) Inventor: Tasuku Koyanagi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 625 days.

(21) Appl. No.: 16/675,857

(22) Filed: Nov. 6, 2019

(65) Prior Publication Data
US 2020/0150341 A1 May 14, 2020

(30) Foreign Application Priority Data
Nov. 12, 2018 (JP) .............................. JP2018-212063

(51) Int. Cl.
*H01L 21/78* (2006.01)
*H01L 33/00* (2010.01)

(52) U.S. Cl.
CPC .......... *H01L 21/78* (2013.01); *H01L 21/7806* (2013.01); *H01L 33/0093* (2020.05)

(58) Field of Classification Search
CPC ............. H01L 33/0093; H01L 21/7806; H01L 21/7813; H01L 21/78
See application file for complete search history.

(56) References Cited

U.S. PATENT DOCUMENTS

| 2003/0189215 A1* | 10/2003 | Lee .................. H01C 7/008 257/94 |
| 2015/0221818 A1* | 8/2015 | Morikazu ............. H01S 5/0216 438/22 |
| 2019/0273009 A1* | 9/2019 | Koyanagi ............. H01L 21/304 |

FOREIGN PATENT DOCUMENTS

| CN | 103378228 A | * 10/2013 | ............. H01L 33/00 |
| JP | 10305420 A | 11/1998 | |
| JP | 2013021225 A | 1/2013 | |

* cited by examiner

*Primary Examiner* — Robert G Bachner
*Assistant Examiner* — Molly K Reida
(74) *Attorney, Agent, or Firm* — Greer, Burns & Crain, Ltd.

(57) ABSTRACT

A lift-off method includes a dividing step of dividing a buffer layer and an optical device layer stacked on a front side of a substrate to thereby form separate buffer layers and separate optical device layers, a transfer member bonding step of bonding a transfer member to a front side of the separate optical device layers, a buffer layer breaking step of applying a pulsed laser beam to the separate buffer layers to thereby break the separate buffer layers, and an optical device layer transferring step of transferring the separate optical device layers from the substrate to the transfer member. An energy density of each pulse of the pulsed laser beam is set to 1.0 to 5.0 mJ/mm$^2$.

6 Claims, 7 Drawing Sheets

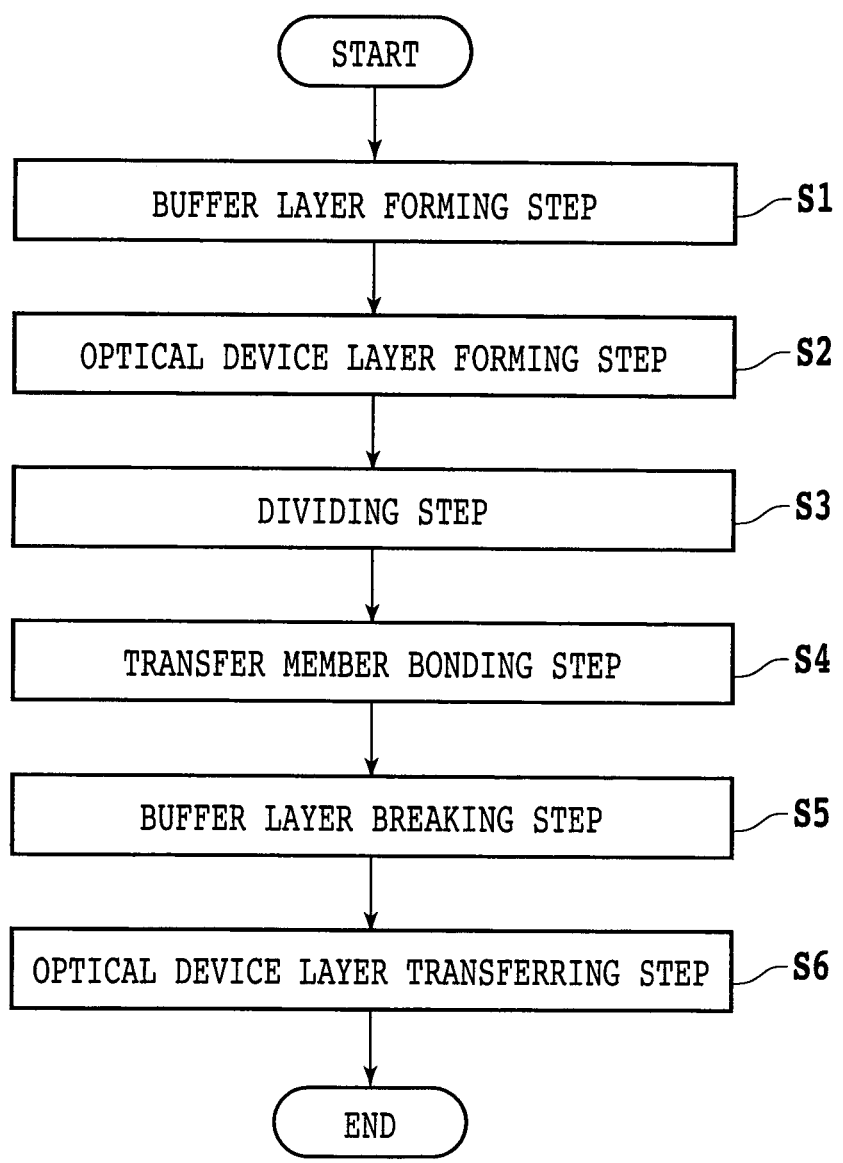

LIFT-OFF METHOD FOR TRANSFERRING OPTICAL DEVICE LAYER

BACKGROUND OF THE INVENTION

Field of the Invention

The present invention relates to a lift-off method for transferring a plurality of separate optical device layers from an optical device wafer to a transfer member, the separate optical device layers being formed on a substrate with a plurality of buffer layers interposed therebetween.

Description of the Related Art

In forming optical device chips such as light emitting diodes (LEDs), a disk-shaped substrate formed of sapphire or silicon carbide (SiC), for example, is prepared and a plurality of crossing division lines are set on the front side of the substrate to thereby define a plurality of separate regions, in which a plurality of optical devices are respectively formed. Each optical device may be formed by epitaxial growth of an n-type semiconductor layer and a p-type semiconductor layer forming a pn junction on the front side of the substrate. After forming the optical devices on the substrate, the substrate is divided along the division lines to obtain the optical device chips. The substrate is divided by using a processing apparatus such as a cutting apparatus and a laser processing apparatus. In the case of using the laser processing apparatus to divide the substrate, a laser beam having an absorption wavelength to the substrate is applied to the substrate along each division line, thereby performing ablation to form a laser processed groove along each division line (see Japanese Patent Laid-open No. Hei 10-305420). The individual optical device chips formed by dividing the substrate are picked up separately by a predetermined method and then mounted in electronic equipment, on another substrate, or the like.

As a method for transferring the optical devices from the substrate without dividing the substrate, there is a method for separating an optical device layer including an n-type semiconductor layer and a p-type semiconductor layer from the substrate. This method includes the steps of forming a buffer layer on the front side of the substrate, next forming an optical device layer on the buffer layer by epitaxial growth, and next applying a laser beam to the buffer layer from the back side of the substrate, the laser beam having a transmission wavelength to the substrate, so that the buffer layer is broken by the laser beam and the optical device layer can therefore be separated from the substrate (see Japanese Patent Laid-open No. 2013-21225). Before separating the optical device layer from the substrate, a transfer member is bonded to the upper surface of the optical device layer. Accordingly, by separating the optical device layer from the substrate, the optical device layer is transferred to the transfer member. This method is also called a laser lift-off method. The optical device layer separated from the substrate is divided into the individual optical devices. If the buffer layer cannot be sufficiently broken (modified) by the laser beam near the interface between the buffer layer and the substrate, the lift-off of the optical device layer ends in failure. Accordingly, the laser beam is applied to the buffer layer under such processing conditions that the buffer layer is reliably broken (modified). Further, also to reduce the time required for the processing, the energy density of each pulse of the pulsed laser beam to be applied to the buffer layer is made as high as possible.

SUMMARY OF THE INVENTION

The optical device layer formed on the buffer layer is divided into separate optical device layers before it is used. If the buffer layer and the optical device layer formed on the substrate are previously divided into separate buffer layers and separate optical device layers corresponding to the individual optical devices, it is unnecessary to divide the optical device layer or the like after transferring the optical device layer to the transfer member, so that the optical devices can be easily formed. However, the buffer layer and the optical device layer are partially removed in an area between the adjacent optical devices by the dividing step. Accordingly, when the laser beam is applied to the separate buffer layers from the back side of the substrate in the subsequent buffer layer breaking step, the laser beam is also applied to the spacing between any adjacent ones of the separate optical device layers. In this spacing, the buffer layer is also partially removed, so that the laser beam is not absorbed in this spacing. As a result, the thermal effect of the laser beam applied to this spacing may cause any damage such as chipping and cracking to the optical device layers near this spacing.

It is therefore an object of the present invention to provide a lift-off method which can transfer the separate optical device layers from the substrate to the transfer member without causing damage to the separate optical device layers.

In accordance with an aspect of the present invention, there is provided a lift-off method including: a buffer layer forming step of forming a buffer layer on a front side of a substrate; an optical device layer forming step of forming an optical device layer on the buffer layer; a dividing step of dividing the buffer layer and the optical device layer into a plurality of separate buffer layers and a plurality of separate optical device layers corresponding to individual devices, respectively, on the front side of the substrate; a transfer member bonding step of bonding a transfer member to a front side of the separate optical device layers; a buffer layer breaking step of applying a pulsed laser beam to the separate buffer layers so that the pulsed laser beam impinges on a back side of the substrate and passes through the substrate to reach the separate buffer layers, after performing the transfer member bonding step, the pulsed laser beam having a wavelength transmissive to the substrate and absorptive to the buffer layer, thereby breaking the separate buffer layers; and an optical device layer transferring step of separating the separate optical device layers from the substrate after performing the buffer layer breaking step, thereby transferring the separate optical device layers to the transfer member, in which an energy density of each pulse of the pulsed laser beam in the buffer layer breaking step is set to 1.0 to 5.0 mJ/mm$^2$.

Preferably, the pulsed laser beam is scanned in plural passes in the buffer layer breaking step.

Preferably, the transfer member includes an expandable tape.

Preferably, the pulsed laser beam is scanned so as to be applied to all of the separate buffer layers in the buffer layer breaking step.

In the lift-off method according to the present invention, an optical device layer is formed on the substrate with a buffer layer interposed therebetween. Thereafter, the buffer layer and the optical device layer are divided into separate buffer layers and separate optical device layers corresponding to individual devices, respectively, before breaking the buffer layer and lifting off the optical device layer. Further, the energy density of each pulse of the pulsed laser beam to be applied to the separate buffer layers is set to 1.0 to 5.0 mJ/mm$^2$. By setting the energy density of each pulse of the pulsed laser beam to this range, the separate buffer layers can be reliably broken without causing damage to the separate optical device layers, so that the separate optical device layers can be easily transferred from the substrate to the transfer member. That is, even when the pulsed laser beam is applied to the spacing between the adjacent buffer layers, the optical device layers are not damaged by the thermal effect of the pulsed laser beam.

Accordingly, the present invention can provide a lift-off method which can transfer the separate optical device layers from the substrate to the transfer member without causing damage to the separate optical device layers.

The above and other objects, features, and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 7 is a flowchart depicting the flow of a lift-off method according to a preferred embodiment of the present invention.

DETAILED DESCRIPTION OF THE PREFERRED EMBODIMENT

A preferred embodiment of the present invention will now be described with reference to the attached drawings. FIG. 7 is a flowchart depicting the flow of a lift-off method according to this preferred embodiment. In the lift-off method depicted in FIG. 7, a buffer layer forming step S1 is performed to form a buffer layer on a substrate, and an optical device layer forming step S2 is next performed to form an optical device layer on the buffer layer. Thereafter, a dividing step S3 is performed to divide the buffer layer and the optical device layer into a plurality of separate regions respectively corresponding to a plurality of individual devices on the substrate. Thereafter, a transfer member bonding step S4 is performed to bond a transfer member to the front side of the optical device layer divided into the separate regions. Thereafter, a buffer layer breaking step S5 is performed to break the buffer layer divided into the separate regions, by applying a pulsed laser beam to the buffer layer so that the pulsed laser beam impinges on the back side of the substrate and passes through the substrate to reach the buffer layer, the pulsed laser beam having a wavelength transmissive to the substrate and absorptive to the buffer layer. Thereafter, an optical device layer transferring step S6 is performed to separate the optical device layer from the substrate, thereby transferring the optical device layer to the transfer member.

Figure 1A:
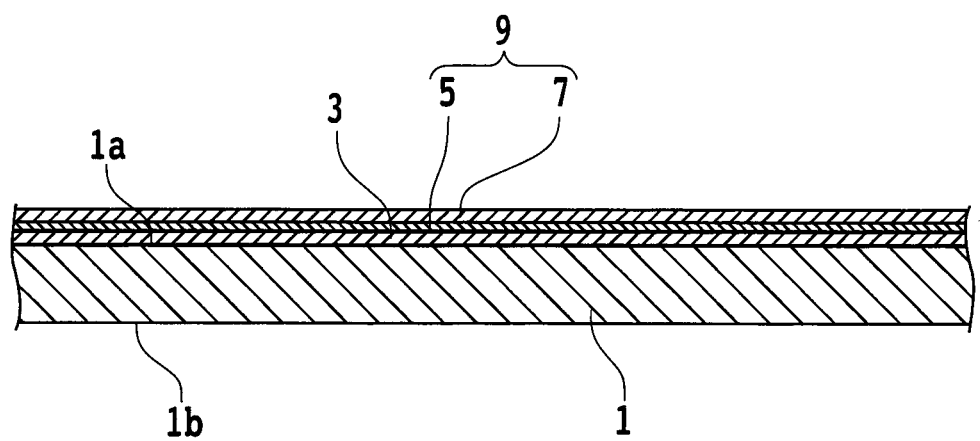
FIG. 1A is a schematic sectional view depicting a buffer layer forming step and an optical device layer forming step.

The buffer layer forming step S1 and the optical device layer forming step S2 will now be described. FIG. 1A is a schematic sectional view depicting the buffer layer forming step S1 and the optical device layer forming step S2. Reference numeral 1 denotes a circular substrate having a front side 1a and a back side 1b. In the buffer layer forming step S1, a buffer layer 3 is formed on the front side 1a of the substrate 1. In the optical device layer forming step S2, an optical device layer 9 is formed on the buffer layer 3. The substrate 1 is not limited in material, shape, structure, size, etc. For example, the substrate 1 may be formed from a semiconductor substrate (e.g., silicon (Si) substrate, SiC substrate, gallium arsenide (GaAs) substrate, indium phosphide (InP) substrate, or gallium nitride (GaN) substrate), a sapphire substrate, a ceramic substrate, a resin substrate, or a metal substrate. Although not depicted, a plurality of crossing division lines are set on the front side 1a of the substrate 1 to thereby define a plurality of separate regions where a plurality of devices are respectively formed. The optical device layer 9 includes a p-type semiconductor layer 5 and an n-type semiconductor layer 7 formed on the p-type semiconductor layer 5. The p-type semiconductor layer 5 is formed on the buffer layer 3. The p-type semiconductor layer 5 is formed of a p-type semiconductor, in which holes are majority carriers. The n-type semiconductor layer 7 is formed of an n-type semiconductor, in which electrons are majority carriers. A pn junction is formed by the p-type semiconductor layer 5 and the n-type semiconductor layer 7 to obtain an optical device capable of emitting light due to the recombination of holes and electrons.

The buffer layer 3 is a layer to be broken by the application of a pulsed laser beam in the buffer layer breaking step S5 to be hereinafter described. The buffer layer 3 functions as a separating layer separating the optical device layer 9 from the substrate 1. The buffer layer 3 also functions as a layer suppressing the generation of defect due to the lattice misfit between the substrate 1 and the p-type semiconductor layer 5. The material of the buffer layer 3 is selected according to the lattice constant of the substrate 1 and the lattice constant of the p-type semiconductor layer 5. The buffer layer 3, the p-type semiconductor layer 5, and the n-type semiconductor layer 7 are not limited in material, but any material capable of forming the optical devices on the substrate 1 may be selected. For example, a sapphire substrate or SiC substrate may be used as the substrate 1. In this case, the buffer layer 3 of GaN, the p-type semiconductor layer 5 of p-type GaN, and the n-type semiconductor layer 7 of n-type GaN may be sequentially formed on the substrate 1 by epitaxial growth. Each of these layers 3, 5, and 7 may be formed by a metal organic chemical vapor deposition (MOCVD) process or a molecular beam epitaxy (MBE) process.

While the optical device layer 9 is composed of the p-type semiconductor layer 5 and the n-type semiconductor layer 7 as depicted in FIG. 1A, the configuration of the optical device layer 9 is not limited. For example, a light emitting layer may be interposed between the p-type semiconductor layer 5 and the n-type semiconductor layer 7 to configure the optical device layer 9, in which light is emitted from the light emitting layer.

Figure 1B:
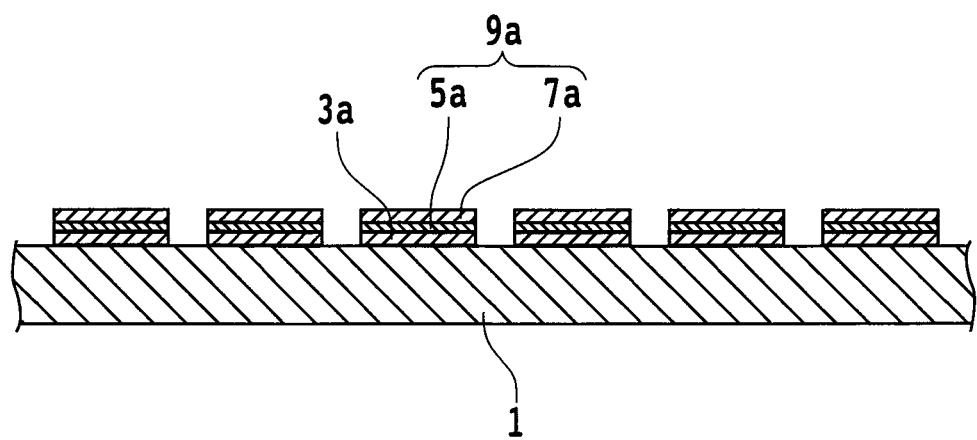
FIG. 1B is a schematic sectional view depicting a dividing step.

After performing the optical device layer forming step S2, the dividing step S3 is performed to partially remove the buffer layer 3 and the optical device layer 9 along each division line to thereby divide the buffer layer 3 and the optical device layer 9 into the plural separate regions respectively corresponding to the plural devices. FIG. 1B is a schematic sectional view depicting the dividing step S3. The removal of the buffer layer 3 and the optical device layer 9 along each division line may be effected by using a dry etching apparatus such as a reactive ion etching (RIE) apparatus and an inductively coupled plasma (ICP) etching apparatus.

Before loading the substrate 1 into the dry etching apparatus, a resist film is previously formed on the front side 1a of the substrate 1 (that is, on the upper surface of the optical device layer 9), and the resist film is next partially removed along each division line. Thereafter, the substrate 1 is loaded into the dry etching apparatus to perform dry etching, thereby removing the optical device layer 9 and the buffer layer 3 in an area exposed between the resist films, that is, in an area where the resist film has been removed. Thereafter, the substrate 1 is unloaded from the dry etching apparatus and the remaining resist film is next removed. In this dry etching, an etchant and processing conditions are suitably selected according to the material of the buffer layer 3 and the optical device layer 9. Further, any other methods may be adopted in performing the dividing step S3. For example, the dividing step S3 may be performed by using a cutting apparatus including a cutting blade having an annular abrasive portion (cutting edge), in which the substrate 1 is cut along each division line. More specifically, the substrate 1 is loaded into the cutting apparatus, and the cutting blade is next rotated about its central through hole, that is, about its axis. Thereafter, the cutting blade is lowered to a vertical position where the lower end of the abrasive portion of the cutting blade reaches the front side 1a of the substrate 1. Thereafter, the substrate 1 and the cutting blade are relatively moved in a horizontal direction to thereby cut the substrate 1 along each division line, that is, cut the optical device layer 9 and the buffer layer 3 along each division line. Thus, the optical device layer 9 and the buffer layer 3 can be partially removed along each division line.

Figure 2:
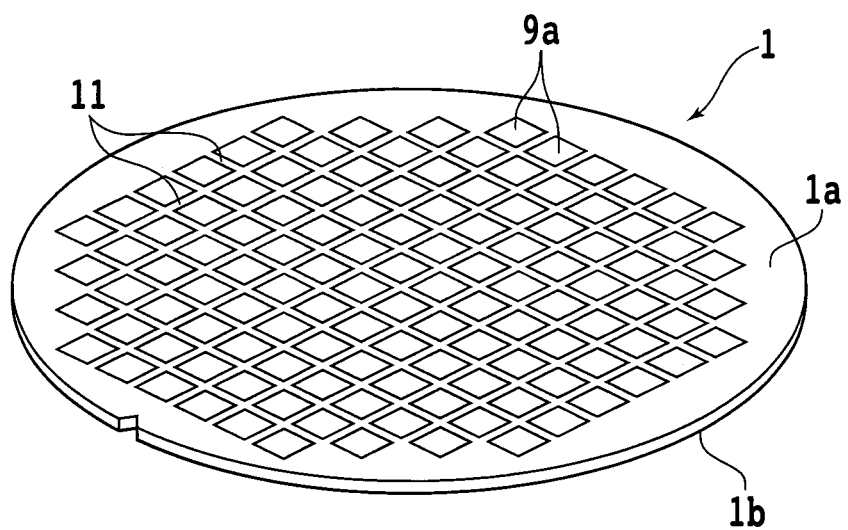
FIG. 2 is a schematic perspective view depicting a substrate on which separate optical device layers are formed by the dividing step.

FIG. 1B depicts a condition obtained by performing the dividing step S3. As depicted in FIG. 1B, a plurality of optical device layers 9a and buffer layers 3a are left on the front side 1a of the substrate 1 by performing the dividing step S3. That is, the optical device layer 9 is divided into the plural optical device layers 9a, and the buffer layer 3 is divided into the plural buffer layers 3a, in which the optical device layers 9a and the buffer layers 3a correspond to the individual devices. Each optical device layer 9a is composed of a p-type semiconductor layer 5a and an n-type semiconductor layer 7a. FIG. 2 is a schematic perspective view of the substrate 1 in the condition depicted in FIG. 1B.

Figure 3:
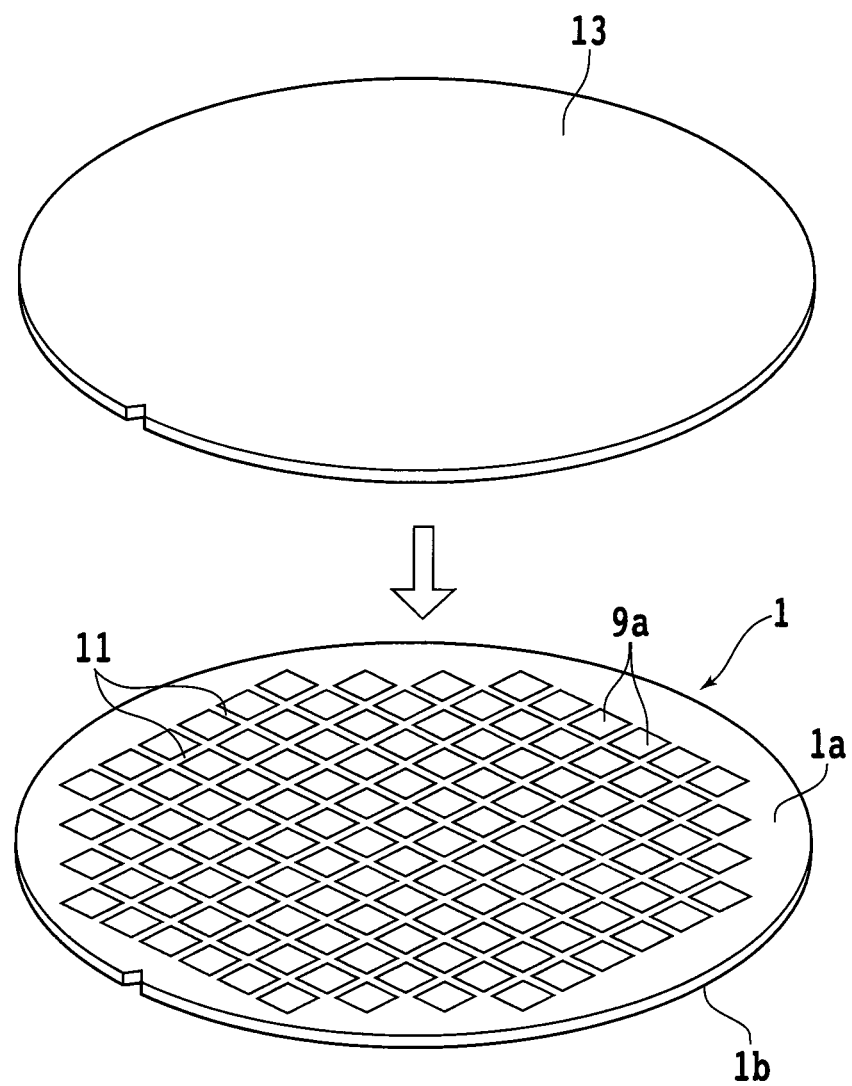
FIG. 3 is a schematic perspective view depicting an example of a transfer member bonding step.

After performing the dividing step S3, the transfer member bonding step S4 is performed as depicted in FIG. 3. FIG. 3 is a schematic perspective view depicting the transfer member bonding step S4. In the transfer member bonding step S4, a transfer member 13 is bonded to the front side of the plural optical device layers 9a formed on the front side 1a of the substrate 1 with the plural buffer layers 3a interposed therebetween. The transfer member 13 is a plate-shaped member supporting the individual devices after performing the optical device layer transferring step S6 to be hereinafter described. For example, the transfer member 13 is formed of Si, copper (Cu), GaAs, gallium phosphide (GaP), or molybdenum (Mo). The transfer member 13 is a circular member having substantially the same diameter as that of the substrate 1. Before bonding the transfer member 13 to the front side of the optical device layers 9a formed on the front side 1a of the substrate 1, an adhesive or wax is previously applied to the bonding surface (one side) of the transfer member 13 to be bonded to the substrate 1. Thereafter, the transfer member 13 is placed on the front side 1a of the substrate 1 in the condition where the bonding surface of the transfer member 13 faces the front side 1a, and a pressure and heat are next applied to the transfer member 13 to thereby bond the transfer member 13 to the substrate 1.

Figure 4:
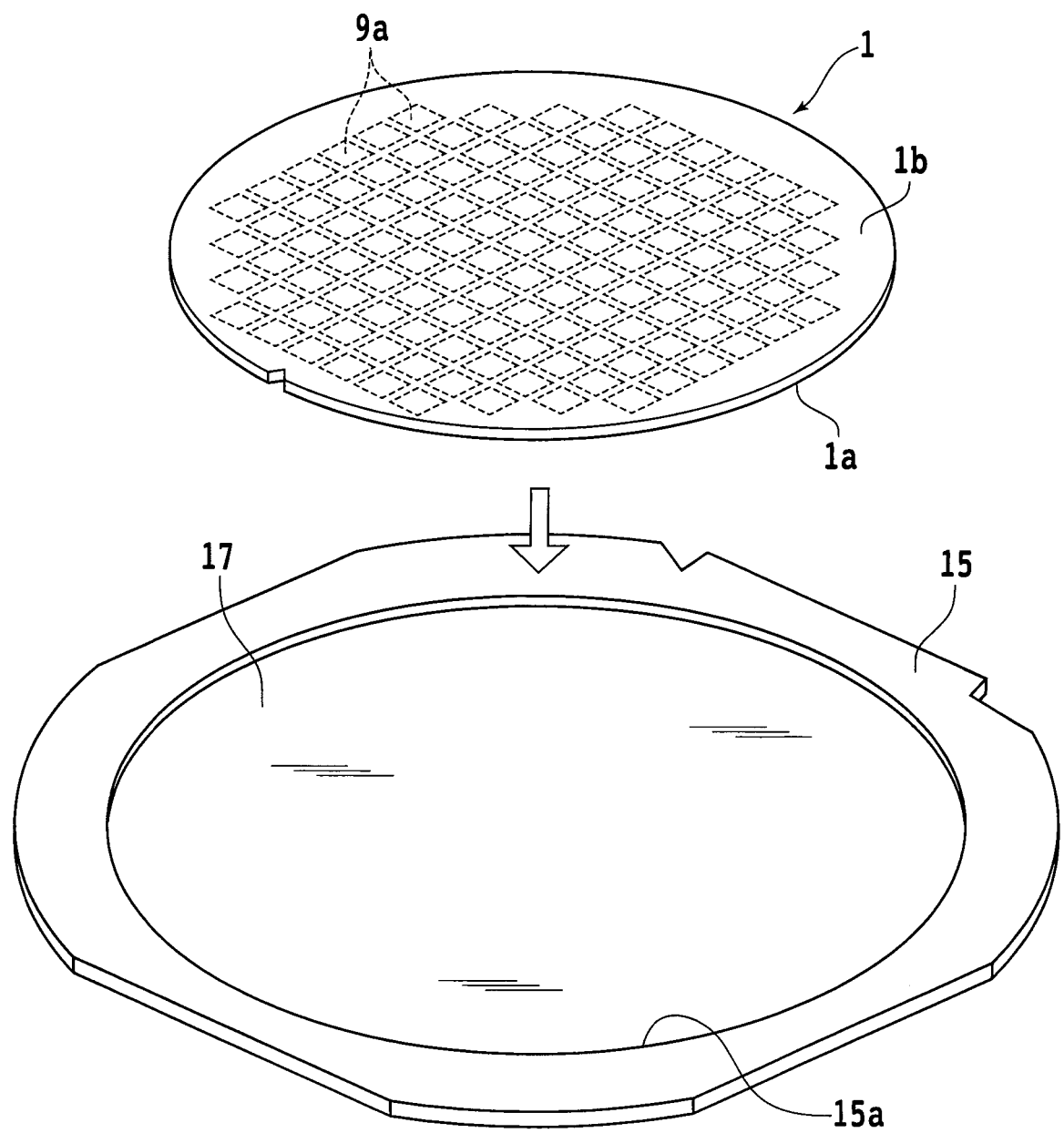
FIG. 4 is a schematic perspective view depicting another example of the transfer member bonding step.

Alternatively, the transfer member to be used in the transfer member bonding step S4 may be an expandable tape called a dicing tape to be used in dividing a semiconductor wafer into individual semiconductor device chips. The tape has an adhesive layer on one side. FIG. 4 is a schematic perspective view depicting the transfer member bonding step S4 in the case that such a tape having an adhesive layer is used as the transfer member 17. In this case, the transfer member 17 has a bonding surface on which the adhesive layer is formed. A ring frame 15 of metal or the like is attached to a peripheral portion of the bonding surface of the transfer member 17. The ring frame 15 has an inside opening 15a to which the bonding surface of the transfer member 17 is exposed. In bonding the transfer member 17 to the substrate 1, the front side 1a of the substrate 1 is opposed to the bonding surface of the transfer member 17 in its central portion exposed to the inside opening 15a of the ring frame 15. Thereafter, the substrate 1 is lowered toward the transfer member 17 until the front side 1a of the substrate 1 comes into contact with the bonding surface of the transfer member 17. Accordingly, the substrate 1 is attached to the transfer member 17. When the substrate 1 is attached to the transfer member 17 in this manner, the back side 1b of the substrate 1 is exposed upward. In the following description of this preferred embodiment, the transfer member 17 attached to the ring frame 15 is used as an example.

Figure 5:
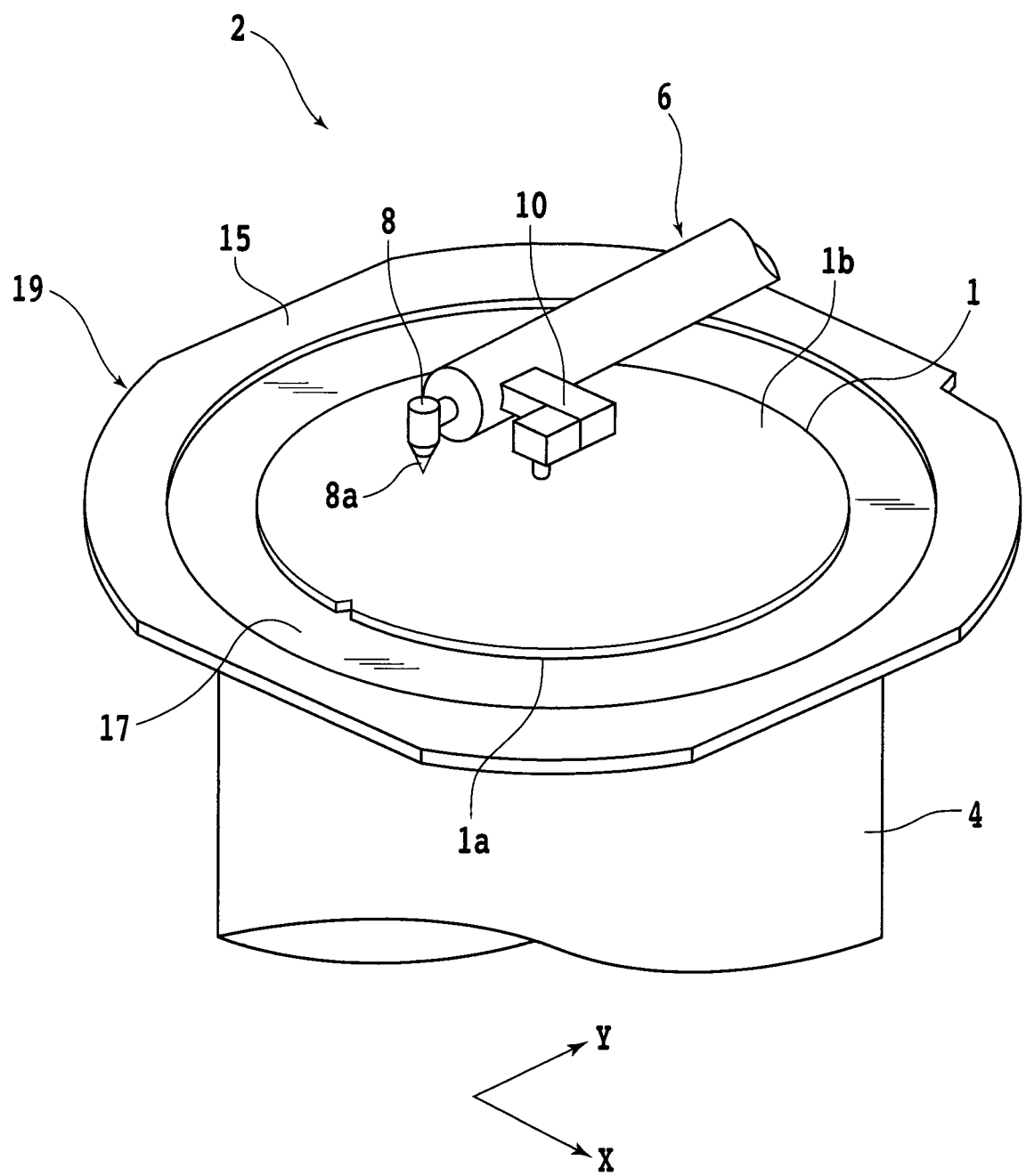
FIG. 5 is a schematic perspective view depicting a buffer layer breaking step.

After performing the transfer member bonding step S4, the buffer layer breaking step S5 is performed. In the buffer layer breaking step S5, a pulsed laser beam having a wavelength transmissive to the substrate 1 and absorptive to the buffer layers 3a is applied to the buffer layers 3a so that the pulsed laser beam impinges on the back side 1b of the substrate 1 and passes through the substrate 1 to reach the buffer layers 3a, thereby breaking the buffer layers 3a. Breaking the buffer layers 3a means changing the atomic arrangement or molecular structure of the material forming the buffer layers 3a or changing the condition of the buffer layers 3a to thereby embrittle the buffer layers 3a, that is, to thereby modify the buffer layers 3a. FIG. 5 is a schematic perspective view depicting the buffer layer breaking step S5. The buffer layer breaking step S5 may be performed by using a laser processing apparatus 2 depicted in FIG. 5. The laser processing apparatus 2 includes a chuck table 4 holding the substrate 1 and a laser processing unit 6 applying a pulsed laser beam 8a to the substrate 1 held on the chuck table 4.

The chuck table 4 has an upper surface provided with a circular porous member. The porous member has substantially the same diameter as that of the substrate 1. A suction passage (not depicted) is formed inside the chuck table 4. One end of the suction passage is connected to the porous member. A vacuum source (not depicted) is connected to the other end of the suction passage. Accordingly, when the substrate 1 is placed on the chuck table 4 and the vacuum source is next operated, a vacuum produced by the vacuum source is applied through the suction passage to the substrate 1, thereby holding the substrate 1 on the chuck table 4 under suction. In other words, the upper surface of the chuck table 4 functions as a holding surface for holding the substrate 1. The laser processing unit 6 includes a processing head 8 applying the pulsed laser beam 8a to the substrate 1 and a camera unit 10 imaging the substrate 1. The camera unit 10 can image the substrate 1 held on the chuck table 4 under suction. By using the camera unit 10, the relative position of the substrate 1 and the laser processing unit 6 and the orientation of the substrate 1 can be adjusted so that the pulsed laser beam 8a is applied to a target position on the substrate 1.

Figure 6:
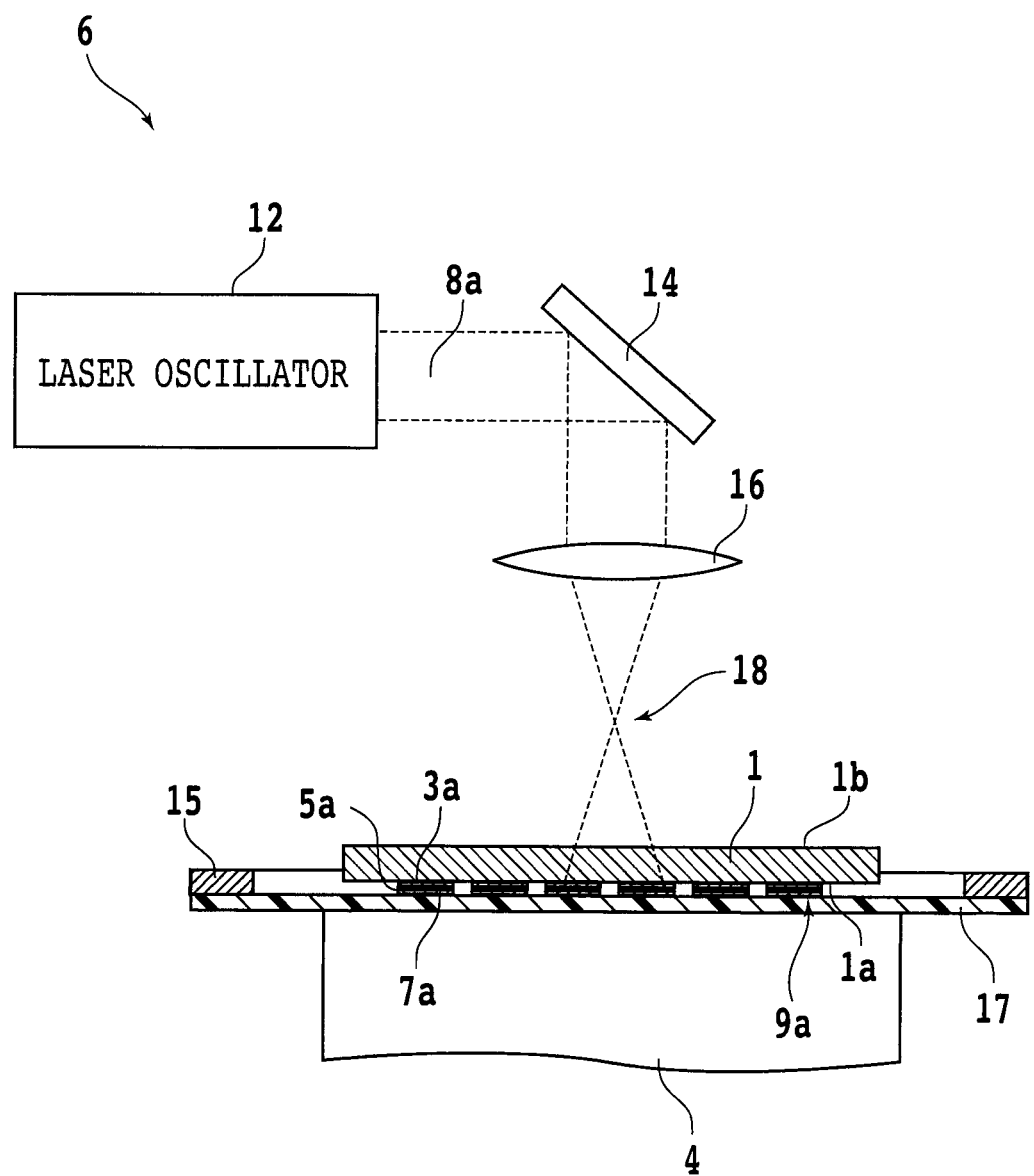
FIG. 6 is a schematic sectional view depicting the buffer layer breaking step.

The laser processing unit 6 will now be described in more detail with reference to FIG. 6. FIG. 6 depicts the configuration of the laser processing unit 6 and the cross section of the substrate 1 to be irradiated with the pulsed laser beam 8a. The laser processing unit 6 includes a laser oscillator 12 generating the pulsed laser beam 8a, a mirror 14 reflecting the pulsed laser beam 8a generated from the laser oscillator 12 to thereby change the traveling direction of the pulsed laser beam 8a to a predetermined direction, and a focusing lens 16 focusing the pulsed laser beam 8a at a predetermined focal position 18. The laser oscillator 12 can generate the pulsed laser beam 8a having a wavelength transmissive to the substrate 1 and absorptive to the buffer layers 3a. For example, in the case that the substrate 1 is a sapphire substrate and the buffer layers 3a are GaN layers, the laser oscillator 12 can generate a pulsed laser beam having a wavelength of 257 nm.

For example, the focusing lens 16 is provided in the processing head 8. The laser processing unit 6 and the chuck table 4 are relatively movable in a vertical direction, so that the focal position 18 of the focusing lens 16 can be set at a predetermined height. Further, the chuck table 4 and the laser processing unit 6 are relatively movable in a horizontal direction parallel to the holding surface of the chuck table 4. The pulsed laser beam 8a is repeatedly generated and at the same time the chuck table 4 and the laser processing unit 6 are relatively moved in a horizontal direction, so that the pulsed laser beam 8a can be scanned on the substrate 1. As a modification, the laser processing unit 6 may include a galvano scanner scanning the pulsed laser beam 8a and a telecentric fθ lens as a focusing lens focusing the pulsed laser beam 8a. In this case, the laser processing unit 6 may include two mirrors 14, in which when the orientation of the mirrors 14 is changed, the focal position 18 can be scanned in a plane parallel to the holding surface of the chuck table 4.

Before performing the buffer layer breaking step S5, the dividing step S3 is performed as described above. Accordingly, the buffer layer 3 and the optical device layer 9 including the p-type semiconductor layer 5 and the n-type semiconductor layer 7 have already been divided into the plural separate regions respectively corresponding to the plural devices. That is, in performing the buffer layer breaking step S4, the buffer layers 3a divided from the buffer layer 3 and the optical device layers 9a divided from the optical device layer 9 have already been formed on the front side 1a of the substrate 1. Accordingly, the p-type semiconductor layer 5 and the n-type semiconductor layer 7 have already been divided into the p-type semiconductor layers 5a and the n-type semiconductor layers 7a, respectively. That is, each optical device layer 9a is composed of the p-type semiconductor layer 5a and the n-type semiconductor layer 7a.

In the buffer layer breaking step S5, the pulsed laser beam 8a is applied to the back side 1b of the substrate 1 and scanned on all the buffer layers 3a formed on the front side 1a of the substrate 1. At this time, the pulsed laser beam 8a is also applied to the spacing defined between any adjacent ones of the buffer layers 3a. When the pulsed laser beam 8a is applied to this spacing, there is a possibility that the thermal effect of the pulsed laser beam 8a may cause any damage such as chipping and cracking to the optical device layers 9a present in the vicinity of this spacing. Accordingly, when the processing conditions of the pulsed laser beam 8a are too strong, the optical device layers 9a may be damaged by the pulsed laser beam 8a scanned in the spacing between the adjacent buffer layers 3a. Conversely, when the processing conditions of the pulsed laser beam 8a are too weak, the buffer layers 3a cannot be sufficiently broken by the pulsed laser beam 8a, so that the optical device layers 9a cannot be properly separated from the substrate 1 in the optical device layer transferring step S6 to be hereinafter described. According to this preferred embodiment, the processing conditions of the pulsed laser beam 8a are previously set so that the optical device layers 9a are not damaged and the buffer layers 3a can be reliably broken. Then, the pulsed laser beam 8a is applied to the buffer layers 3a from the back side 1b of the substrate 1 under the processing conditions previously set above.

More specifically, attention has been focused on the energy density of each pulse of the pulsed laser beam 8a to be applied to the back side 1b of the substrate 1, and the energy density of each pulse of the pulsed laser beam 8a is set to 1.0 to 5.0 mJ/mm$^2$. That is, by setting the energy density of each pulse of the pulsed laser beam 8a to this range, the optical device layers 9a are not damaged and the buffer layers 3a can be reliably broken. To set the energy density to this range, the energy of each pulse of the pulsed laser beam 8a to be generated from the laser oscillator 12 is set to 0.5 to 10 µJ. Further, the focal position 18 of the focusing lens 16 is set to a position above the back side 1b of the substrate 1 by a distance of 2.0 to 5.0 mm. This distance from the back side 1b of the substrate 1 to the focal position 18 is called a defocus amount.

In the case that the buffer layer 3 is not divided into the buffer layers 3a before performing the buffer layer breaking step S5 and the pulsed laser beam 8a is applied to the buffer layer 3 formed on the whole of the front side 1a of the substrate 1, the height of the focal position 18 is set so that the buffer layer 3 can be reliably broken. That is, the height of the focal position 18 is set to the height of the back side 1b of the substrate 1 or to a position below the back side 1b of the substrate 1 toward the buffer layer 3. In contrast, according to this preferred embodiment, the focal position 18 is set at a position above the back side 1b of the substrate 1 by a large distance in order to set the energy density of each pulse of the pulsed laser beam 8a to the range described above. For example, the focal position 18 may be set at a position above the back side 1b of the substrate 1 by a distance 6 to 17 times the thickness of the substrate 1. That is, the defocus amount may be set in the range of 2.0 to 5.0 mm or in the range of 6 to 17 times the thickness of the substrate 1.

In performing the buffer layer breaking step S5, the substrate 1 supported through the transfer member 17 to the ring frame 15 is placed through the transfer member 17 on the holding surface of the chuck table 4 in the laser processing apparatus 2 in the condition where the front side 1a of the substrate 1 is oriented downward and the back side 1b of the substrate 1 is exposed upward. Thereafter, the vacuum source connected to the chuck table 4 is operated to hold the substrate 1 on the chuck table 4 under suction. Thereafter, the focal position 18 of the focusing lens 16 is set at the predetermined position above the back side 1b of the substrate 1. Thereafter, the pulsed laser beam 8a is applied to the buffer layers 3a so that the pulsed laser beam 8a impinges on the back side 1b of the substrate 1 and passes through the substrate 1 to reach the buffer layers 3a. In the case that the laser processing unit 6 includes a galvano scanner, the pulsed laser beam 8a is scanned so as to be moved in a direction parallel to the back side 1b of the substrate 1 so that the pulsed laser beam 8a is applied to all the areas on the back side 1b of the substrate 1. At this time, the focal position 18 is spirally moved from the center of the back side 1b of the substrate 1 to the outer circumference thereof in a plane parallel to the back side 1b of the substrate 1.

For example, the pulsed laser beam 8a is first applied to the center of the back side 1b of the substrate 1. Thereafter, the pulsed laser beam 8a is moved in the radial direction of the substrate 1 from the center to the outer circumference thereof. At the same time, the chuck table 4 is rotated to thereby rotate the substrate 1 about its center. During this operation, the generation of the pulsed laser beam 8a is repeated by the laser oscillator 12. Accordingly, the pulsed laser beam 8a is spirally scanned from the center to the outer circumference of the back side 1b of the substrate 1. At this time, the spots of the pulsed laser beam 8a on the back side 1b of the substrate 1 are overlapped at a rate of approximately 80% to 95%. During the scanning of the pulsed laser beam 8a, the rotational speed of the substrate 1 is gradually reduced with a decrease in distance from the spot of the pulsed laser beam 8a to the outer circumference of the substrate 1, in order to make the overlap rate constant. In the buffer layer breaking step S5, the scanning of the pulsed laser beam 8a may be performed in plural passes, e.g., in three passes. In the case of performing the scanning of the pulsed laser beam 8a in plural passes, the height of the focal position 18 may be changed or unchanged.

After performing the buffer layer breaking step S5 to break the buffer layers 3a, the optical device layer transferring step S6 is performed to separate the optical device layers 9a from the substrate 1, thereby transferring the optical device layers 9a to the transfer member 17. In the optical device layer transferring step S6, the optical device layers 9a may be separated from the substrate 1 by removing the substrate 1 away from the transfer member 17. At this time, the optical device layers 9a are left on the transfer member 17. Thus, the optical device layers 9a can be lifted off from the substrate 1. In the case that a tape is used as the transfer member 17 in this preferred embodiment, an expanding step may be performed after performing the optical device layer transferring step S6. In this expanding step, the tape as the transfer member 17 is expanded in the radially outward direction to thereby increase the spacing between any adjacent ones of the optical device layers 9a attached to the tape. Accordingly, each optical device layer 9a can be easily picked up from the tape.

In the lift-off method according to this preferred embodiment, the optical device layer 9 is divided into the optical device layers 9a before lifting off the optical device layer 9 from the substrate 1. Accordingly, it is unnecessary to divide the optical device layer 9 after lifting off it from the substrate 1. Further, in the buffer layer breaking step S5, the pulsed laser beam 8a breaking the buffer layers 3a is also applied to the spacing between the adjacent optical device layers 9a. However, since the energy density of each pulse of the pulsed laser beam 8a is set in the range described above, the buffer layers 3a can be broken without causing damage to the optical device layers 9a.

EXAMPLE

In Example, the buffer layer forming step S1 to the transfer member bonding step S4 were performed to a plurality of substrates 1 under the same conditions to prepare a plurality of samples. Thereafter, the buffer layer breaking step S5 was performed to these samples by changing the processing conditions of the pulsed laser beam 8a to be applied to each sample. That is, breaking of the buffer layers 3a by the pulsed laser beam 8a was performed to examine the relation between the energy density of each pulse of the pulsed laser beam 8a and the result of processing by the pulsed laser beam 8a.

In Example, a sapphire substrate was used as each substrate 1. First, the buffer layer forming step S1 was performed to form a buffer layer 3 of GaN on the front side 1a of each substrate 1. Thereafter, the optical device layer forming step S2 was performed to sequentially form a p-type semiconductor layer 5 of p-type GaN and an n-type semiconductor layer 7 of n-type GaN on the buffer layer 3 by epitaxial growth, thereby forming an optical device layer 9 on the buffer layer 3. Thereafter, the dividing step S3 was performed to divide the buffer layer 3 and the optical device layer 9 into a plurality of buffer layers 3a and a plurality of optical device layers 9a respectively corresponding to the plural devices to be obtained. Thereafter, the transfer member bonding step S4 was performed to attach a tape called a dicing tape as the transfer member 17 on the optical device layers 9a formed on the front side 1a of each substrate 1 with the buffer layers 3a interposed therebetween. The thickness of each substrate 1 was set to 300 μm. The thickness of the buffer layer 3 was set to 1 μm. The thickness of the optical device layer 9 was set to 5 μm. The shape of each device was set to a square having a size of 10 μm×10 μm. The spacing between the adjacent devices was set to 5 μm.

Thereafter, the buffer layer breaking step S5 was performed to each sample by using the laser processing apparatus 2 depicted in FIG. 5. The laser processing unit 6 was operated to apply the pulsed laser beam 8a having a wavelength of 257 nm to the back side 1b of each substrate 1. The wavelength of 257 nm is a wavelength transmissive to each substrate 1 (transmission wavelength to each substrate 1) and absorptive to the buffer layer 3 (absorption wavelength to the buffer layer 3). For each sample, the height (defocus amount) of the focal position 18 from the back side 1b of each substrate 1 was set in the range of 2.0 to 2.5 mm. The spot diameter of the pulsed laser beam 8a to be applied to the back side 1b (the diameter of a circular spot formed on the back side 1b by the pulsed laser beam 8a) was set in the range of 50 to 65 μm. Further, the repetition frequency of the pulsed laser beam 8a to be applied was set in the range of 50 to 200 kHz.

In Example, six samples were prepared to perform the buffer layer breaking step S5 under different processing conditions. Thereafter, the optical device layer transferring step S6 was performed. More specifically, the energy density of each pulse of the pulsed laser beam 8a in the buffer layer breaking step S5 was changed as depicted in Table below. In Table, the result of processing to each sample is also depicted.

TABLE 1

| Sample | Energy density (mJ/mm²) | Result |
| --- | --- | --- |
| Comparison 1 | 0.75 | A large force was required in separating the optical device layers, so that the optical device layers were damaged. |
| Example 1 | 1.21 | The optical device layers were not damaged and could be well separated. |
| Example 2 | 1.51 | The optical device layers were not damaged and could be well separated. |
| Example 3 | 3.31 | The optical device layers were not damaged and could be well separated. |
| Example 4 | 4.97 | The optical device layers were not damaged and could be well separated. |
| Comparison 2 | 5.27 | The optical device layers were damaged due to the application of the pulsed laser beam. |

In the sample of "Comparison 1," the energy density of each pulse of the pulsed laser beam 8a was set to approximately 0.75 mJ/mm². In "Comparison 1," the optical device layers 9a could not be easily separated from the substrate 1 in performing the optical device layer transferring step S6. That is, a relatively large force was required to separate the optical device layers 9a. This result is considered to be due to the fact that the buffer layers 3a could not be sufficiently broken in the buffer layer breaking step S5. Since such a large force was required in separating the optical device layers 9a, the optical device layers 9a were damaged. In the sample of "Comparison 2," the energy density of each pulse of the pulsed laser beam 8a in the buffer layer breaking step S5 was set to approximately 5.27 mJ/mm². In "Comparison 2," a part of the optical device layers 9a was damaged in applying the pulsed laser beam 8a to the back side 1b of the substrate 1 in the buffer layer breaking step S5. This result is considered to be due to the fact that the thermal effect of the pulsed laser beam 8a applied to the spacing between the adjacent buffer layers 3a, that is, between the adjacent optical device layers 9a caused damage to the optical device layers 9a.

In the samples of "Example 1," "Example 2," "Example 3," and "Example 4," the energy density of each pulse of the pulsed laser beam 8a in the buffer layer breaking step S5 was set to approximately 1.21 mJ/mm², approximately 1.51 mJ/mm², approximately 3.31 mJ/mm², and approximately 4.97 mJ/mm², respectively. In each sample, any damage to the optical device layers 9a due to the application of the pulsed laser beam 8a was not observed. Further, in performing the optical device layer transferring step S6, the optical device layers 9a could be easily separated from the substrate 1. According to Example, it was observed that the optical device layers 9a could be easily separated from the substrate 1 without causing damage to the optical device layers 9a when the energy density of each pulse of the pulsed laser beam 8a was set to 1.0 to 5.0 mJ/mm².

According to the above preferred embodiment, it is possible to provide a lift-off method which can transfer the optical device layers 9a from the substrate 1 to the transfer member 17 without causing damage to the optical device layers 9a. In this lift-off method, the optical device layer 9 is first formed on the front side 1a of the substrate 1 and next divided into the optical device layers 9a. Thus, the optical device layers 9a divided from the optical device layer 9 are formed on the front side 1a of the substrate 1. Thereafter, the optical device layers 9a are transferred from the substrate 1 to the transfer member 17. Accordingly, after transferring the optical device layers 9a to the transfer member 17, it is unnecessary to divide the optical device layer 9, so that the optical devices can be easily formed.

The present invention is not limited to the above preferred embodiment, but various modifications may be made. For example, while the optical device layer 9 is first formed on the substrate 1 and next divided into the optical device layers 9a in the above preferred embodiment, the present invention is not limited to this preferred embodiment. For example, a semiconductor device layer forming integrated circuits (ICs) and large scale integrations (LSIs) rather than an optical device layer may be formed on the substrate 1.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A lift-off method comprising:
   a buffer layer forming step of forming a buffer layer on a front side of a substrate;
   an optical device layer forming step of forming an optical device layer on the buffer layer;
   a dividing step of dividing the buffer layer and the optical device layer into a plurality of separate buffer layers and a plurality of separate optical device layers corresponding to individual devices, respectively, on the front side of the substrate;
   a transfer member bonding step of bonding a transfer member to a front side of the separate optical device layers;
   a buffer layer breaking step of applying a pulsed laser beam to the separate buffer layers so that the pulsed laser beam impinges on a back side of the substrate and passes through the substrate to reach the separate buffer layers, after performing the transfer member bonding step, the pulsed laser beam having a wavelength transmissive to the substrate and absorptive to the buffer layer, thereby breaking the separate buffer layers; and
   an optical device layer transferring step of separating the separate optical device layers from the substrate after performing the buffer layer breaking step, thereby transferring the separate optical device layers to the transfer member,
   wherein an energy density of each pulse of the pulsed laser beam in the buffer layer breaking step is set to 1.0 to 5.0 mJ/mm², and
   wherein a focal position of the pulsed laser beam is set at a position above the back side of the substrate.

2. The lift-off method according to claim 1, wherein the pulsed laser beam is scanned in plural passes in the buffer layer breaking step.

3. The lift-off method according to claim 1, wherein the transfer member includes an expandable tape.

4. The lift-off method according to claim 1, wherein the pulsed laser beam is scanned so as to be applied to all of the separate buffer layers in the buffer layer breaking step.

5. The lift-off method according to claim 1, wherein the focal position of the pulsed laser beam is 2.0 to 5.0 mm above the back side of the substrate.

6. The lift-off method according to claim 1, wherein
a defocus defined by a distance from the back side of the substrate to the focal position is 6 to 17 times the thickness of the substrate.

* * * * *